United States Patent [19]

Culican, Sr. et al.

[11] Patent Number: 4,833,425
[45] Date of Patent: May 23, 1989

[54] ANALOG MACRO EMBEDDED IN A DIGITAL GATE ARRAY

[75] Inventors: Edward F. Culican, Sr., Hyde Park; John D. Davis, Beacon; John F. Ewen, Yorktown Heights; Scott A. Mc Cabe, Highland, all of N.Y.; Joseph M. Mosley, Boca Raton, Fla.; Allan L. Mullgrav, Jr., Wappingers Falls, N.Y.; Philip F. Noto, Marlboro, N.Y.; Clarence I. Peterson, Jr., Wappingers Falls, N.Y.; Philip E. Pritzlaff, Jr., Highland, N.Y.

[73] Assignee: International Business Machines Corporation, Armonk, N.Y.

[21] Appl. No.: 173,517

[22] Filed: Mar. 25, 1988

[51] Int. Cl.⁴ .............................................. H03L 7/08
[52] U.S. Cl. ...................................... 331/1 A; 331/25
[58] Field of Search .................... 331/1 A, 2, 11, 18, 331/25, 46

[56] References Cited

U.S. PATENT DOCUMENTS

| 4,069,462 | 1/1978 | Dunn | 331/11 |
| 4,227,158 | 10/1980 | Schroeder et al. | 331/2 |
| 4,388,597 | 6/1983 | Bickley et al. | 331/2 |
| 4,394,769 | 7/1983 | Lull | 377/116 |
| 4,594,563 | 6/1986 | Williams | 331/1 A |
| 4,689,581 | 8/1987 | Talbot | 331/1 A |

Primary Examiner—Eugene R. LaRoche
Assistant Examiner—Robert J. Pascal
Attorney, Agent, or Firm—William T. Ellis

[57] ABSTRACT

A single logic gate array chip is disclosed having a first portion dedicated to the generation of one or more clock signals and the remaining portion occupied by logic circuits. The first portion uses the same gate array cell design as embodied in the logic circuits of the remaining portion. Both portions are powered by similar gate array metallization patterns, although some of the cells of the clock signal sources are disconnected from the normal chip powering busses and are powered instead by respective control signal generators. Each control signal represents the frequency difference between a given clock signal and a reference signal. The cells which are powered by a given control signal introduce a commensurate signal delay to drive the clock signal frequency into a predetermined relationship with the frequency of the reference signal.

13 Claims, 2 Drawing Sheets

U.S. Patent    May 23, 1989    Sheet 2 of 2    4,833,425

ANALOG MACRO EMBEDDED IN A DIGITAL GATE ARRAY

DESCRIPTION

1. Field of the Invention

The present invention relates to logic gate array chips, also termed master slices, and more particularly concerns such chips adapted to provide analog functions and digital functions from respective areas of the same chip.

2. Background of the Invention

As chips become larger in size and greater in circuit density and approach the complexity of computer systems, the need arises to incorporate both analog and digital functions on the same chip.

In a straightforward approach, each of the required analog circuits and digital circuits can be designed separately, without regard to the other. However, such an approach does not permit any exploitation of pre-existing chip designs of exclusively one functional kind to incorporate the other functional kind, e.g. to add analog functions to a pre-existing digital function gate array.

SUMMARY OF THE INVENTION

One object of the present invention is to implement analog as well as digital functions on the same gate array or masterslice chip without the need for more than one basic gate or masterslice cell design.

Another object is to provide oscillator and logic functions on the same gate array chip using the same basic gate design.

A further object is to provide a plurality of different frequency oscillators as well as logic functions on the same gate array chip.

Another object is to provide a plurality of different frequency oscillators and logic functions on the same gate array using similar array powering metallization patterns.

Yet another object is to add oscillator function to a pre-existing logic gate array using the same cell design.

These and other objects are achieved, in accordance with a preferred embodiment of the present invention, by the provision of a logic gate array having one portion dedicated to the generation of at least one oscillator signal. The dedicated portion utilizes the same gate array cell design and similar array powering metallization patterns as the remaining logic portion of the array.

In one embodiment, the invention comprises
a single semiconductor chip for performing both logic and analog functions, comprising:
a gate array composed of cells with digital logic elements therein disposed on the single chip, with each of the cells having a power supply line;
a main power bus for providing electrical power to the power supply lines of the gate array cells;
means for connecting the logic elements in a plurality of the cells to form at least one oscillating circuit, oscillating at a signal frequency;
means for disconnecting the main power bus from a first set of the cells used to form the oscillating circuit;
means for receiving the frequency signal from the at least one oscillating circuit and for receiving a reference frequency signal, and for generating a control signal indicative of the frequency difference between the signal frequencies; and
means for providing the control signal to the power supply lines of the first set of cells used to form the oscillating circuit to provide a controlled amount of power thereto in order to control the frequency of oscillation of the oscillating circuit.

In a second embodiment, each generation circuit is comprised of a phase comparator, a reference frequency circuit, and an odd number of array cells connected in an oscillator loop whereby each oscillator loop cell in this odd number of array cells inverts and delays its respective input signal.

The amount of delay introduced by each oscillator loop cell is a function of its applied power supply voltage. Accordingly, the chip power line buss is connected to all of the cells of the array except for the oscillator loop cells which instead are powered by the control voltage output of a respective phase comparator. The comparator provides a control voltage determined by the difference in frequencies of its two input signals. One input signal is a desired reference signal. The other of the input signals is obtained from the loop-connected oscillator cells, either directly, or after a frequency division or multiplication operation has been performed.

If more than one oscillator frequency is desired on-chip, then a separate generation circuit is used for each frequency, with a different frequency division or multiplication operation performed on each oscillator loop output prior to application of the signal to its respective comparator. The same reference signal, however, is used for all phase comparators.

BRIEF DESCRIPTION OF THE DRAWINGS

For a more complete understanding of the present invention, reference should be made to the following detailed description and drawings of which

DESCRIPTION OF THE PREFERRED EMBODIMENT

Figure 1:
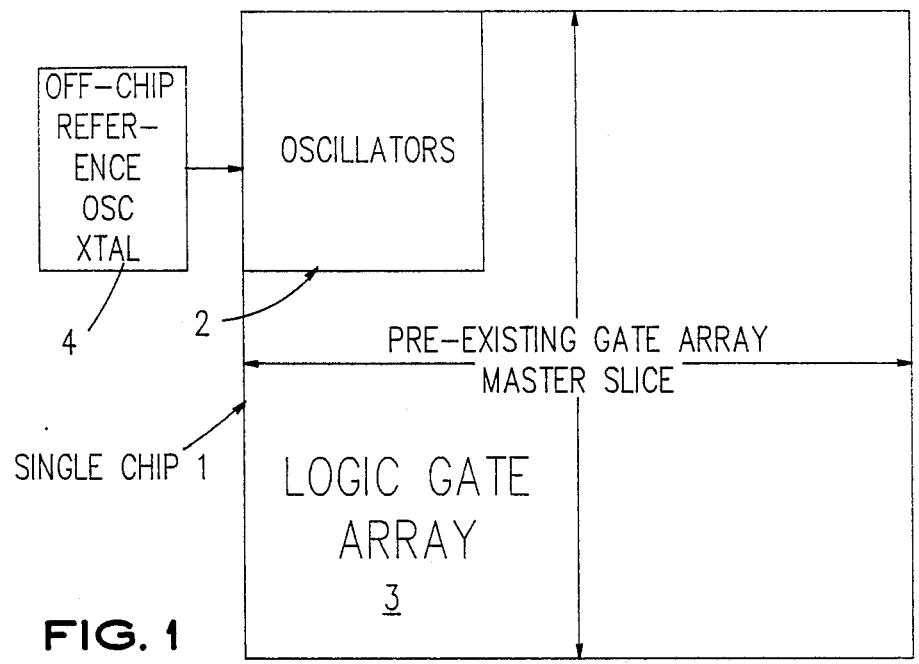
FIG. 1 is a simplified chip layout diagram illustrating the relative positioning of the reference signal oscillator, loop-connected oscillators and logic gate array of a preferred embodiment of the present invention.

Referring to FIG. 1, the preferred embodiment exemplifies the introduction of two clock oscillators e.g., operating at the respective frequencies of 40 Mhz and 32 Mhz, on a single, pre-existing gate array chip 1. The oscillators are located within region 2 conveniently positioned along the accessible perimeter of chip 1. Region 2, along with region 3 of chip 1, is uniformly provided with the same gate array cells in accordance with gate array or masterslice design technology. The array cells in region 2, however, are connected together to form a pair of oscillator signal sources. Additionally, as further described later, some of the cells of region 2 are disconnected from the chip busses that otherwise power the cells of the entire chip.

For enhanced stability, the oscillators of region 2 may be crystal controlled. For this purpose, a single off-chip crystal 4 is connected to a single on-chip reference oscillator 5 (shown in FIG. 2) also located within region 2.

In past designs, reference clock oscillator frequencies have been generated by respective crystal oscillator units, one crystal unit used per frequency. In accordance with one feature of the present invention, however, the individual units are replaced by the single off-chip crystal 4 of FIG. 2, a single on-chip reference oscillator 5 and a plurality of phase/frequency locked loops 6 and 7 to generate a desired pair of reference clock frequencies. By integrating the reference oscillator and the phase locked loops onto a single chip, a substantial cost savings can be realized over separate crystal oscillator units.

A further cost savings is available, in accordance with another feature of the present invention, by implementing the on-chip oscillator units using the cells of a pre-existing gate array or masterslice design originally created to implement logic circuits.

Figure 2:
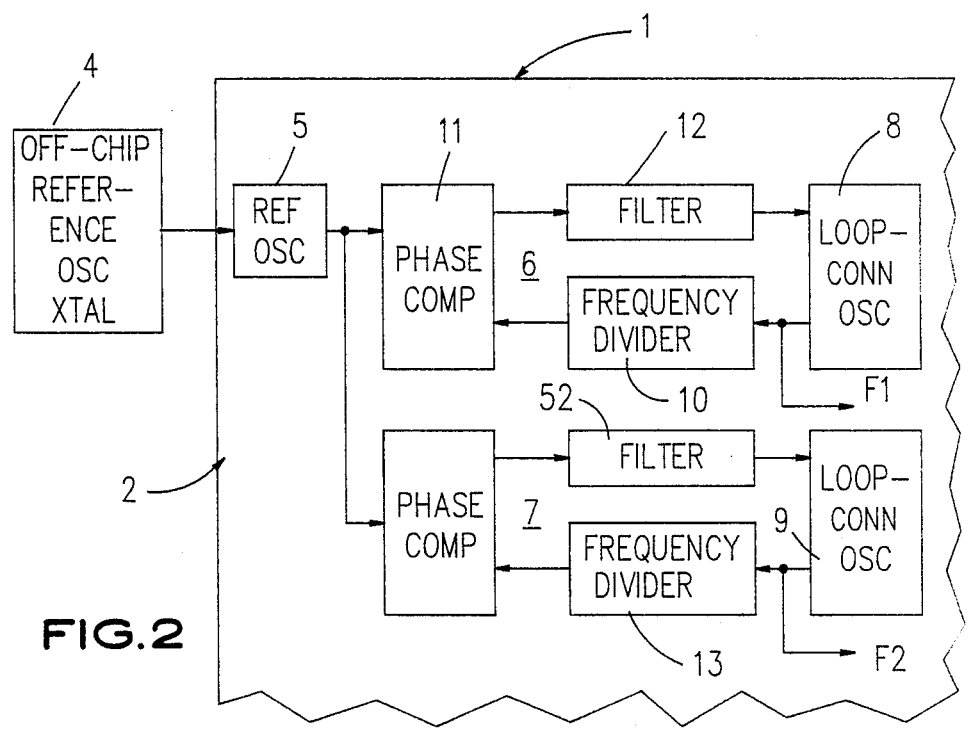
FIG. 2 is a block diagram of each phase-locked loop oscillator of FIG. 1.

FIG. 2 illustrates the manner in which the frequency from off-chip crystal 4 stabilizes a respective oscillator 8 in the phase lock loop 6 and a respective oscillator 9 in the phase lock loop 7. In the phase lock loop 6 configuration illustrated in FIG. 2, the signal from oscillator 8 is applied via a frequency divider 10 to one input of a phase/frequency comparator 11. The second input of the comparator 11 is obtained from crystal controlled reference oscillator 5. In this embodiment an output control voltage containing a direct component representing the frequency difference between the two inputs is provided by comparator 11. The direct component of the control voltage is extracted by a filter 12 and applied as a powering voltage to oscillator 8. In conventional servo-feedback fashion, the divided-down frequency of oscillator 8, available at the output of divider 10, is constrained to be substantially equal to the frequency of reference oscillator 5. Thus, the harmonically related frequency of oscillator 8 (where divider 10 introduces a whole integer quotient) is likewise closely frequency stabilized. Fully analogous operation may be achieved by utilizing a signal frequency multiplier instead of a signal frequency divider, in which case the respective loop-connected oscillator would be driven to operate at a subharmonic of the frequency of reference oscillator 5.

The apparatus and operation of loop 7 corresponds to the above-described loop 6, the only difference being that oscillator 9 operates at a frequency determined by the quotient of frequency divider 13 rather than by the quotient of frequency divider 10.

Figure 3:
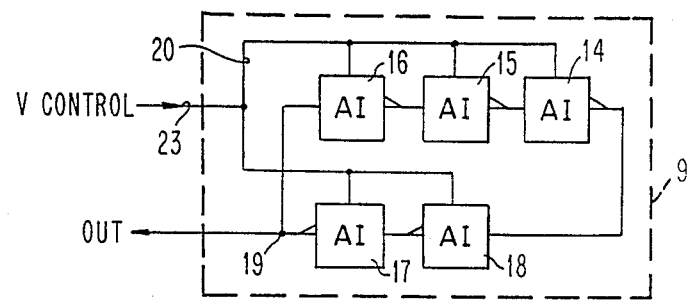
FIG. 3 is a block diagram of the loop-connected oscillator cells of FIG. 2.

The present invention is not restricted to any one specific circuit design or technology. Suitable implementation for both loop 6 and loop 7 is described, for example, in U.S. Pat. No. 4,594,563 issued on June 10, 1986 to Marshall Williams. Many specific circuit designs are available to those skilled in the art, depending upon the basic cell design and technology of the gate array chip employed, e.g., bipolar or FET technology. FIG. 3 illustrates a design configuration for oscillators 8, 9 using AND-INVERT (AI) array cells connected in a loop design.

It will be noted from FIG. 3 that each oscillator loop comprises an odd-number of AND-INVERT cells such as 14, 15, 16, 17 and 18. In operation, a "one" present at the input (node 19) of, for example, cell 16 remains as a "one" at that node until the "one" travels fully around the inverter loop, with the odd number of cummulative inversions and delays introduced by the cells, causing a "zero" to arrive at the node 19. The change from "one" to "zero" at output node 19 occurs at one half the repetition rate of the loop oscillator. Node 19 then remains at a "zero" value for five stage delays, (in this example) until the "zero" has propagated through the loop and been inverted at node 19 by the odd number of inverter cells.

The oscillator repetition rate can be varied by changing the time delay experienced by the propagating pulse in traversing each of the cells 17, 18, 14, 15 and 16. It has been found that control of the propagational delay can be realized in response to changes in circuit powering potential. It has also been found that a $T^2L$ circuit implementation of the basic AND-INVERT calls is especially advantageous for obtaining delay control of the loop oscillator repetition rate, particularly where the loop cells are low-powered, relative to the higher performance powering of the cells used in the logic portion of the gate array chip. Relatively low or high powering of the cells can be readily accomplished simply by controlling the value of the AND-INVERT cell load resistors. This load resistor area may be determined by the area of the impurity implantation or diffusion mask used in forming the load resistors.

In order to control the propagational delay of each loop cell, a control voltage is applied via power line 20 to cells 14, 15, 16, 17 and 18 in FIG. 3. The control voltage is derived from the output of the respective loop filter, such as filter 12 of loop 6 of FIG. 2 and will typically vary from 1.4 to 2.2 volts. However, all of the cells of chip 1 are ordinarily powered by the same power busses. Accordingly, it becomes necessary, when adding the loop-connected oscillators to a pre-existing gate array, to isolate the loop cells from said power busses.

Figure 4:
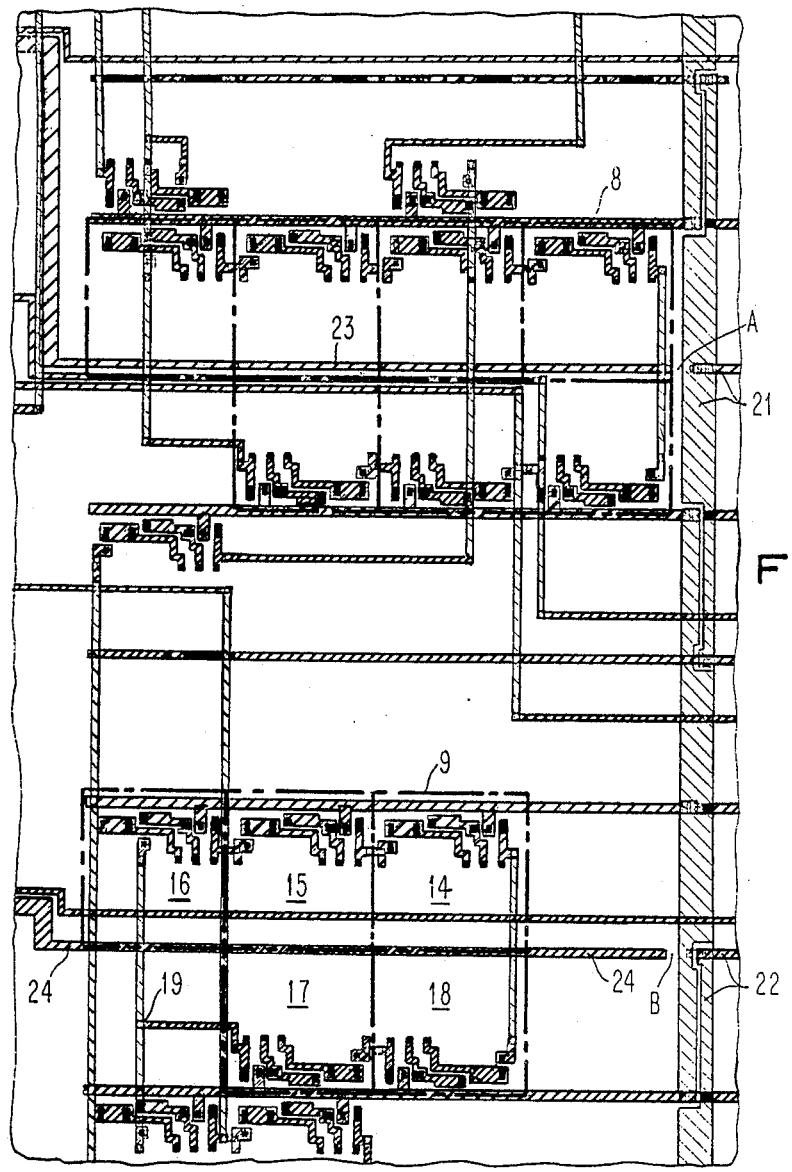
FIG. 4 is a representative metallization pattern for the loop-connected oscillator portion of FIG. 1.

FIG. 4 shows oscillator loops 8 and 9 disconnected at respective points A & B from the normal chip power distribution busses 21 and 22. The isolated cell power lines 23 and 24 are connected instead to the output lines from the respective loop filters such as filter 12 of loop 6 and filter 52 of loop 7 of FIG. 2, as previously explained. The required disconnections and the required connections between the loop filters and the isolated cell power lines can be readily accomplished by customizing a metal patterning mask for region 2 of gate array chip 1 of FIG. 1. The correspondence of the AI cells 14–18 in FIG. 3 are shown in FIG. 4 for the lower AI loop in the Figure.

While the present invention has been particularly shown and described with reference to preferred embodiments therefor, it will be understood by those skilled in the art that the foregoing and other changes in form and detail may be made therein without departing from the spirit and the scope of the present invention, as defined in the appended claims.

We claim:
1. A single semiconductor chip for performing both logic and analog functions, comprising:
   a gate array composed of cells with digital logic elements therein disposed on said single chip, with each of said cells having a power supply line;
   a main power bus for providing electrical power to the power supply lines of said gate array cells;
   means for connecting said logic elements in a plurality of said cells to form at least one oscillating circuit, oscillating at a signal frequency;
   means for disconnecting said main power bus from a first set of said cells used to form said oscillating circuit;

means for receiving said frequency signal from said at least one oscillating circuit and for receiving a reference frequency signal, and for generating a control signal indicative of the frequency difference between said signal frequencies; and means for providing said control signal to the power supply lines of said first set of cells used to form said oscillating circuit to provide a controlled amount of power thereto in order to control the frequency of oscillation of said oscillating circuit.

2. A chip as defined as in claim 1, wherein said cells are transistor-transistor-logic cells.

3. A chip as defined in claim 1, wherein said receiving means includes a phase detector for receiving a reference frequency signal and comparing said reference frequency signal to the oscillation frequency signal of said oscillating circuit.

4. A chip as defined in claim 1, wherein said oscillating circuit comprises a recirculating loop.

5. A chip as defined in claim 1, wherein said oscillating circuit comprises a recirculating loop of voltage inverters, with the power supply lines of said inverters connected to said control signal from said receiving means.

6. A chip as defined in claim 1 wherein said cells associated with said logic functions are high-powered relative to said cells associated with said analog functions.

7. A chip as defined in claim 1 further comprising means connected to the output of said oscillating circuit for dividing said oscillating frequency of said oscillating circuit by a first factor to obtain a second frequency, which second frequency is applied to said receiving means to be compared with said reference frequency signal.

8. A chip as defined in claim 7 wherein said factor is greater than one.

9. A chip as defined in claim 7, further including means to cause said oscillating circuit in combination with said receiving means, said control signal providing means, and said frequency dividing means to operate as a first phase-locked loop circuit for controlling the frequency of said oscillator circuit in accordance with said reference frequency signal.

10. A chip as defined in claim 7, further comprising;
second means for connecting said logic elements in a second plurality of said cells to form a second oscillating circuit, oscillating at a third signal frequency;
second means for disconnecting said main power bus from a second set of said cells used to form said second oscillating circuit;
second means connected to the output of said second oscillating circuit for dividing by a second factor said third oscillating frequency of said second oscillating circuit to form a fourth frequency signal;
second means for receiving said fourth frequency signal and said reference frequency signal and generating a second control signal indicative of the frequency difference between said fourth frequency signal and said reference frequency signal; and means for providing said second control signal to the power supply lines of said second set of cells used to form said second oscillating circuit to provide a controlled amount of power thereto in order to control the third frequency of oscillation of said second oscillating circuit.

11. A gate array chip for performing both logic and frequency generation functions, comprising;
a plurality of logic cells, with each logic cell having a power supply line;
a main power bus for providing electrical power to the power supply lines of said cells;
a first recirculating loop formed by connection of a first set of said cells, said first recirculating loop oscillating at a first frequency;
a second recirculating loop formed by connection of a second set of said cells, said second recirculating loop oscillating at a second frequency;
means for disconnecting said main power bus from a first plurality of the cells in said first set of cells and from a second plurality of said cells in said second set of cells;
means for providing a reference frequency signal;
a first phase/frequency-locked loop including first means for generating a third signal that is indicative of said first frequency signal; first means for comparing said third frequency signal to said reference frequency signal and for generating a first control signal indicative of the frequency difference therebetween; and first means for providing said first control signal to the power supply lines of said first plurality of cells of said first set of cells to provide a controlled amount of power thereto in order to control the frequency of oscillation of said first recirculating loop; and
a second phase/frequency-locked loop including second means for generating a fourth signal that is indicative of said second frequency signal; second means for comparing said fourth frequency signal to said reference frequency signal and generating a second control signal indicative of the frequency difference therebetween; and second means for providing said second control signal to the power supply lines of said second plurality of cells of said second set of cells to provide a controlled amount of power thereto in order to control the frequency of oscillation of said second recirculating loop.

12. A gate array chip as defined in claim 11, wherein said first and second recirculating loops are formed by transistor-transistor logic cells.

13. A gate array circuit as defined in claim 12, wherein said first means for generating a third signal and said second means for generating a fourth signal are either signal frequency dividers or signal frequency multipliers.

* * * * *